United States Patent [19]

Ackerman et al.

[11] Patent Number: 4,982,333
[45] Date of Patent: Jan. 1, 1991

[54] CAPACITANCE GUIDED ASSEMBLY OF PARTS

[75] Inventors: David A. Ackerman, Hopewell; Robert A. Boie, Westfield, both of N.J.

[73] Assignee: AT&T Bell Laboratories, Murray Hill, N.J.

[21] Appl. No.: 256,661

[22] Filed: Oct. 13, 1988

[51] Int. Cl.$^5$ .............................................. G06F 15/46
[52] U.S. Cl. .................................. 364/468; 324/61 P; 318/568.16; 364/183; 364/481; 364/513; 901/9; 901/35; 901/45; 901/46
[58] Field of Search ............... 364/468, 513, 130, 400, 364/183, 481–483, 550, 551.01, 167.01; 414/730, ; 901/45, 35, 46, 9; 324/60 R, 60 C, 61 R, 61 P, 61 QS, 61 QL, 60 CD; 318/638, 639, 662, 568.16, 568.21

[56] References Cited

U.S. PATENT DOCUMENTS

| | | | |
|---|---|---|---|
| 4,481,616 | 11/1984 | Matey | 369/58 |
| 4,485,453 | 11/1984 | Taylor | 901/45 X |
| 4,557,386 | 12/1985 | Buckley et al. | 901/45 X |
| 4,850,631 | 7/1989 | Dotsko | 901/35 X |

OTHER PUBLICATIONS

Cho et al.–"Robotic Assembly: A Synthesizing Overview", Robotica (1987), vol. 5, pp. 153–165.
G. Boothroyd, Corrando Poli and Laurence E. Murch, *Automatic Assembly*, Marcel Dekker, New York, (1982).
Benjamin C. Kuo, *Automatic Control Systems*, third edition, Prentice Hall, (1975), pp. 1–15.
A. M. Thompson, *The Precise Measurement of Small Capacitances*, IRE Transactions on Instrumentations, vol. 1–7, pp. 245–253; Dec. 1958.
R. V. Jones and J. S. C. Richards, *The Design and Application of Capacitance Micrometers*, Journal of Physics E, Science Instruments, vol. Series 2, 1973, pp. 589–600.
F. W. Sinden and R. A. Boie, *A Planar Capacitive Force Sensor with Six Degrees of Freedom*, IEEE Intern. Conf. on Robotics and Automation, San Francisco, CA, 1986, pp. 1806–1814.
G. L. Miller, D. V. Lang and L. C. Kimerling, *Capacitance Transient Spectroscopy*, Ann. Rev. Material Sci., 7:377–448 (1977).
Peter S. Maybeck, *Stochastic Models, Estimation and Control*, vol. 1, Academic Press, 1979.
Paul Hoffman, *TAB Implementation and Trends*, Solid State Technology, Jun. 1988.

*Primary Examiner*—Joseph Ruggiero
*Attorney, Agent, or Firm*—W. L. Wisner; Martin S. Landis

[57] ABSTRACT

There are disclosed methods and apparatuses for the assembling of parts using capacitive sensing, both for controlling the closure or "homing" phase of the assembly process and for acquiring one or more of the parts prior to that phase. Assembling of semiconductor parts to essentially two-dimensional and three-dimensional packages, the insertion of a peg in a hole, and an application to tape-automated-bonding (TAB) technology are all described, as are various representations of the resulting capacitive data. Included are the uses of scheduling and optical sensing to supplement capacitive sensing in the methods and apparatuses.

16 Claims, 20 Drawing Sheets

.74mm DIE - .84mm PAD 0.1mm GAP

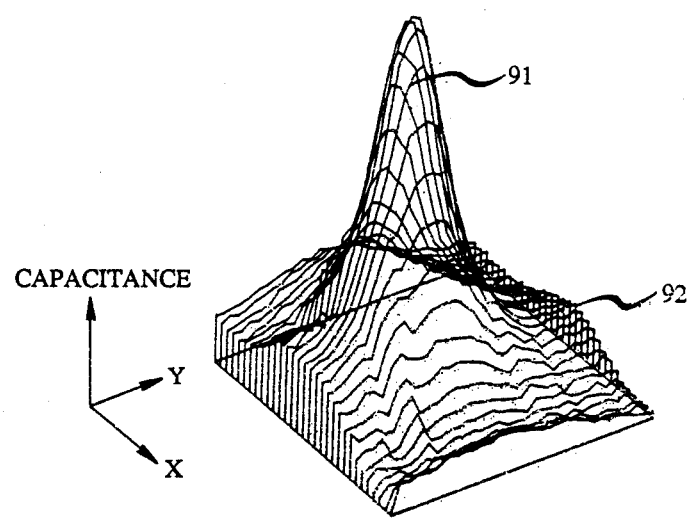
FIG. 9A
FIG. 9
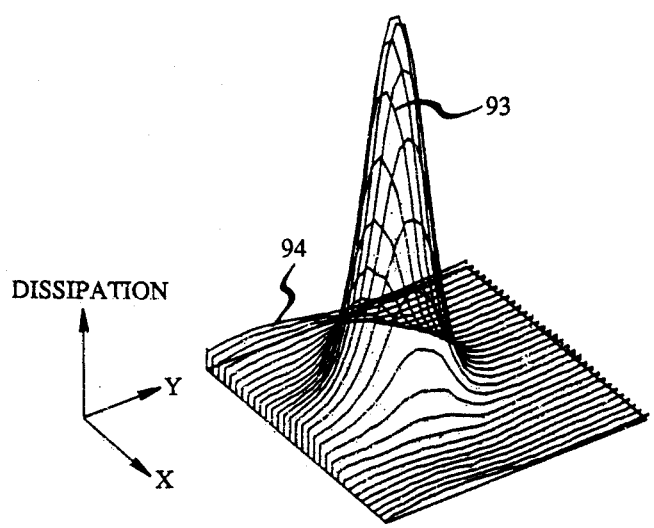
FIG. 9B

X POSITION (MILS)
3.7 MIL GAP

X POSITION (MILS)
2.2 MIL GAP

X POSITION (MILS)
1.4 MIL GAP

X POSITION (MILS)
0.8 MIL GAP

FIG. 25
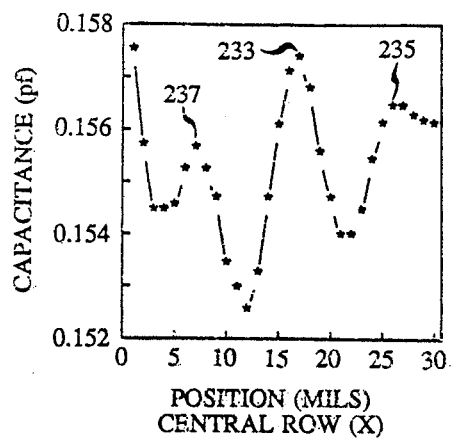
FIG. 25A
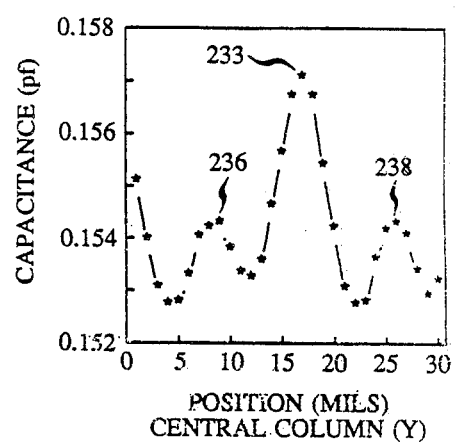
FIG. 25B
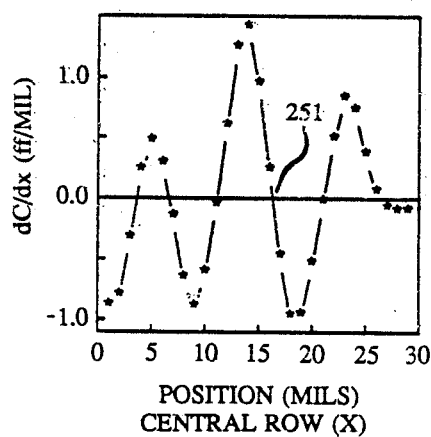
FIG. 25C
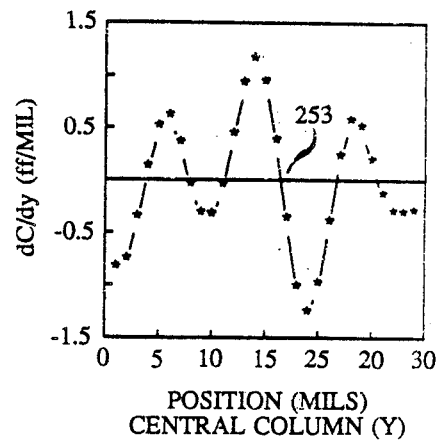
FIG. 25D

CAPACITANCE GUIDED ASSEMBLY OF PARTS

FIELD OF THE INVENTION

This invention relates to the automatic assembling of objects from separate parts by means of closed-loop control of the relative position of the parts.

BACKGROUND OF THE INVENTION

An assembly process can usually be decomposed into a sequence of tasks each designed to bring pairs of objects together and join them. The process is simplified in several ways if some form of part-to-part homing is used in bringing parts together. A military example of assembly by homing is that of a cruise missile assembling itself onto the center of the unfortunate target. The homing information comes from comparing on board sensor data with stored maps. The alignment of a photo-detector with a light carrying fiber is an industrial example where direct part-to-part homing may be used. Biological examples of sensor homing abound. Direct homing implies that one part senses alignment information from the other.

Lacking a sense of homing, industrial assembly often uses some form of control by schedule during the bringing together or closure phase of the operation.

Consider, for example, the so called "pick and place" assembly procedure. The separated objects are brought together by picking up one object and placing it onto the other. Before the objects can be placed, relative locations and orientations, the configuration of the mating surfaces and the assembly mechanisms need to be established. The configuration is determined either by sensing, using for example machine vision, or more often by mechanical means such as from the geometric constraints imposed by parts feeders, jigs and holding fixtures. In the picking phase one part is engaged by a gripping or holding tool of the mechanism, temporarily assembling it to the tool. The parts are brought together into an aligned condition in a third closure phase using a scheduled motion that is in accordance with estimates of the beginning configuration and the desired final configuration. The parts are joined in a fourth phase. Joining may require a complicated mechanical procedure such as screw fastening or, as is the case in this example, a simple release of the moved part. Of course, there are many possible ways to assemble objects. This description is nevertheless quite typical and serves to illustrate the open-loop aspect of presently used control methods. We will not consider the transport and joining tasks. Further examples and details of automatic assembly processes can be found in the book by G. Boothroyd, Corrando Poli and Laurence E. Murch, "Automatic Assembly", Marcel Dekker, New York, (1982).

Let us now return to the closure phase in more detail. The scheduled motion is with respect to the final alignment of parts an open-loop procedure. Only the initial configuration is estimated, no direct or continuos measurement of the relationships of the mating surfaces is available. Many arguments that support the need for high precision and absolute accuracy robots and assembly machines are linked to assembly methods that have restricted knowledge of the configuration of the parts during closure. Parts mating accuracy is then ultimately limited by a combination of uncertainties in the initial configuration estimate, gripping and motion. An attractive alternative approach is to arrange for homing towards the aligned condition. A suitably located machine vision camera can in principle provide such information indirectly while observing the mating surfaces of both parts as they are brought together. However, these measurements are most important during the final closure phase when the parts themselves may obscure the measurement and the assembly must proceed from that point forward using a scheduled motion.

We have recognized that there is great need in this and other phases of the automatic assembly art to minimize reliance open-loop control by providing a direct and continuous measurement of the configuration of the mating surfaces so that closed-loop control can be used throughout critical portions of assembly.

The techniques for closed-loop feedback control are well known in the control system art. The basis of the techniques are described by Benjamin C. Kuo, "Automatic Control Systems," third edition, Prentice Hall, (1975), pp. 1-15. Our description concentrates on the integration of measurement with such techniques.

SUMMARY OF THE INVENTION

Our invention is based upon our recognition that a solution to the foregoing problem is the selective use of capacitive sensing during critical phases of the assembly process.

According to our invention capacitance-guided assembly is based on our observation that the relative position and orientation, or configuration, of two separated parts or objects can often be uniquely associated with the mutual capacitance of the parts or electrodes associated with the parts and that this capacitance measurement may be used in a closed-loop feedback control system to bring parts and other objects together into an aligned condition. Advantageously, the capacitive effect becomes increasingly strong and provides a more sensitive measurement for control purposes as the separation is reduced toward closure.

According to a primary feature of our invention, the objects are arranged to move in the region between the two electrodes of the capacitance. It is usually convenient to arrange that at least one of the objects is fixedly associated with one of the other electrodes. The other part may or may not be fixedly associated with the other electrode.

We utilize the correspondence between the geometry of objects and their mutual capacitance and the high sensitivity of capacitance measurements. The high sensitivity is inherent and results from the fact that capacitors themselves generate no noise. Precise and high resolution measurements of capacitors are well known in the art as discussed by A. M. Thompson, "The Precise Measurement of Small Capacitances", IRE Transactions on Instrumentation, Vol. 1-7, pp. 245-253. The use of capacitive transducers for high resolution distance measurement is also an established technique as discussed by R. V. Jones and J. S. C. Richards, "The Design and Application of Capacitance Micrometers, Journal of Physics E, Science Instruments, Vol. 6, Series 2, 1973, pp. 589-600. A description of how capacitive methods may be used to measure all six degrees of position and orientation of two objects is found in a paper by F. W. Sinden and R. A. Boie, "A Planar Capacitive Force Sensor with Six Degrees of Freedom", Proc, IEEE Intern. Conf. on Robotics and Automation, San Francisco, CA, 1986, pp. 1806-1814. According to a subordinate feature of our invention, the final closure of the parts may be assisted by the use of optical detection techniques, which synergistically may also modify the capacitance between the electrodes at this time. This effect further accentuates the fact that capacitance guided assembly, in the preferred mode of operation, becomes increasingly sensitive as the parts come closer to the aligned condition.

BRIEF DESCRIPTION OF THE DRAWING

Other features and advantages of our invention will become apparent from the following detailed description, taken together with the drawings, in which:

FIG. 9 comprises curves showing laser diode junction capacitance and dissipation as a function of light-beam position.

FIG. 25 shows curves of data of FIG. 23 along the central row, curve (a), and central column, curve (b), and capacitance gradient curves (c) and (d) for the foregoing data.

GENERAL DESCRIPTION

In order to appreciate the description of the following embodiments, the following principles need to be observed.

As an illustrative simple example of part-to-part homing using mutual capacitance sensing, consider the task of placing two planar objects, (for example, two rectangular metal plates) one on top of the other and such that they overlap each other to the maximum extent. The problem is initially further simplified by constraining the plates to lie in parallel planes with variable and controlled separation. The mutual capacitance due to planar motion is maximum, for any separation, when the objects overlap to the maximum extent. Reducing the separation increases both the maximum value and the non-aligned spatial derivatives of capacitance. Signals that become stronger and sharper as the separation decreases are ideal for assembly. The nearer the parts are to closure the more certain is the alignment measurement. Such (admittedly highly constrained) objects may be assembled by maximizing the capacitance, through linear motions and rotation in the plane, as the separation is reduced. The initial constraint may also be relaxed since a sufficient condition for parallelism, for any fixed separation and under overlapping conditions, is that capacitance changes more specifically, the capacitance derivative with respect to angle, be minimized with respect to rotations out of the plane. In principle, the mating surfaces of these simple objects may be aligned with respect to all six degrees of freedom using only mutual capacitance measurements. A direct method for part-to-part homing is realized.

If objects have the same dimensions, a unique planar motion maximum occurs at each separation, while differing and complicated shaped objects may, of course, exhibit many maxima. In such cases, the aligned condition may be associated with relationships of capacitance to position and orientation other than the maximum or minimum value. We describe capacitance guidance by the use of examples taken from realistic assembly tasks. The assembly guidance of a lightwave detector is used to provide an example of the assembly of planar or basically two dimensional objects. The placement of a photodetector or laser diode onto the all silicon lightwave package provides an example of two dimensional die to be placed in fixed relationship to a three dimensional structure, while an example of the peg-in-hole problem involves two simple three dimensional objects. We conclude with results on the assembly guidance of die-to-tape in Tape Automated Bonding technology (TAB).

DETAILED DESCRIPTION

Figure 3:
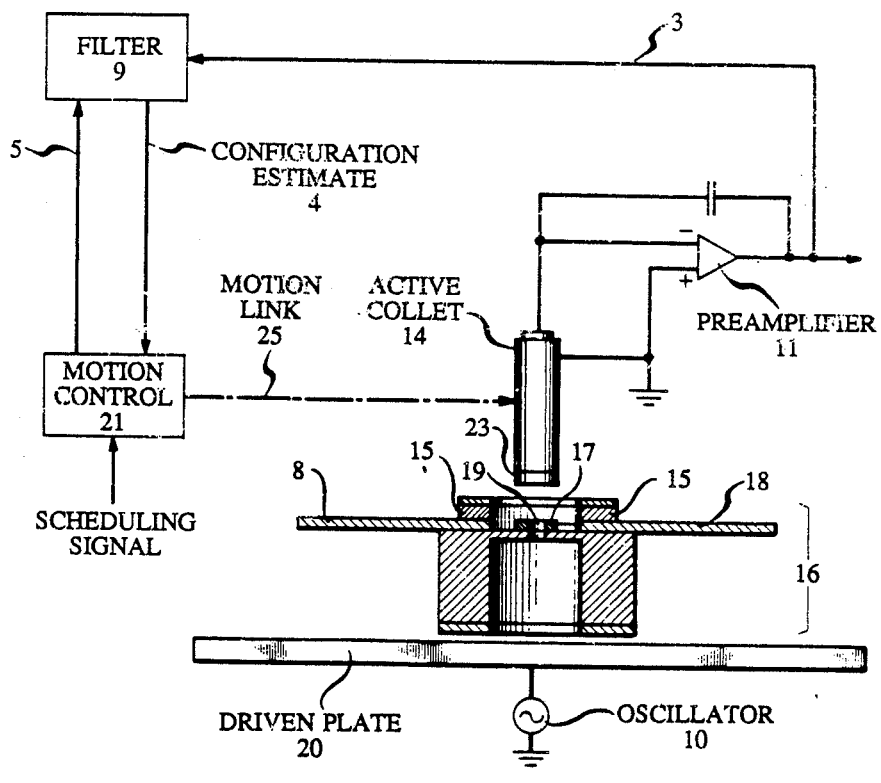
FIG. 3 illustrates an an embodiment of the invention for assembling a photodetector or laser die 23 to the pad 17.

To understand the first task, we refer briefly to FIG. 3. We begin with the closure phase of a pick, place and bond assembly of a photo-detector die 23 onto its respective package bonding pad 17. The die 23 is to be bonded to pad 17. This fixes the die 23, active face down, while providing an electrical connection to one side of the detector diode to the bonding pad. The second electrical contact is made in a later operation to a top side detector contact via a wire bond connection to separate conductive pad 8. The light enters from below and through the hole 19 onto the detector.

The closure task is successfully completed when die and pad are separated by a very small gap while overlapping to the maximum extent and hence in the proper position for bonding. For simplicity of explanation, we assume that the angular alignment is pre-established so that only three degrees of freedom need be considered (i.e., x, y and z). This parts closure task is similar to that for two rectangular plates, mentioned above.

We choose to measure the capacitance between die and pad by a method that is both contactless, requiring no direct connection to either object, and suitable for metal and insulating objects. An understanding of the functional form of the mutual capacitance between die and pad is facilitated by first examining the capacitance topography of the bonding pad. Techniques for measuring surface topography by capacitive means are described by James R. Matey, "Scanning Capacitance Microscopy," U.S. Pat. No. 4,481,616.

Figure 1:
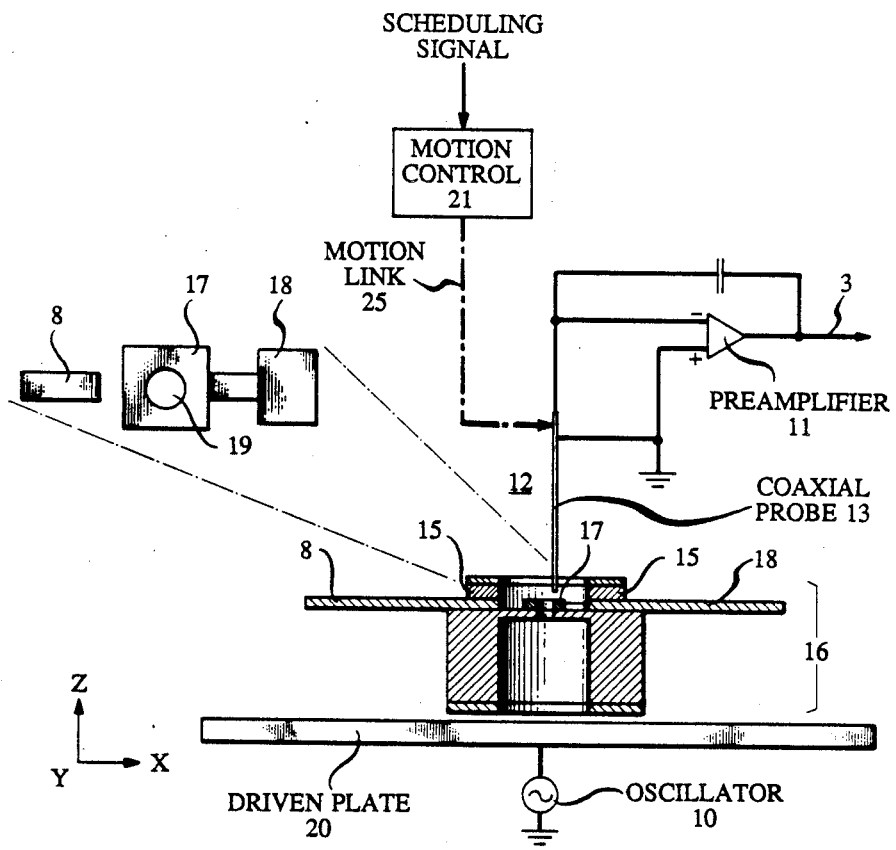
FIG. 1 illustrates a method used to measure the capacitance topography of the bonding pad 17 of a photodector package 16.
Figure 16:
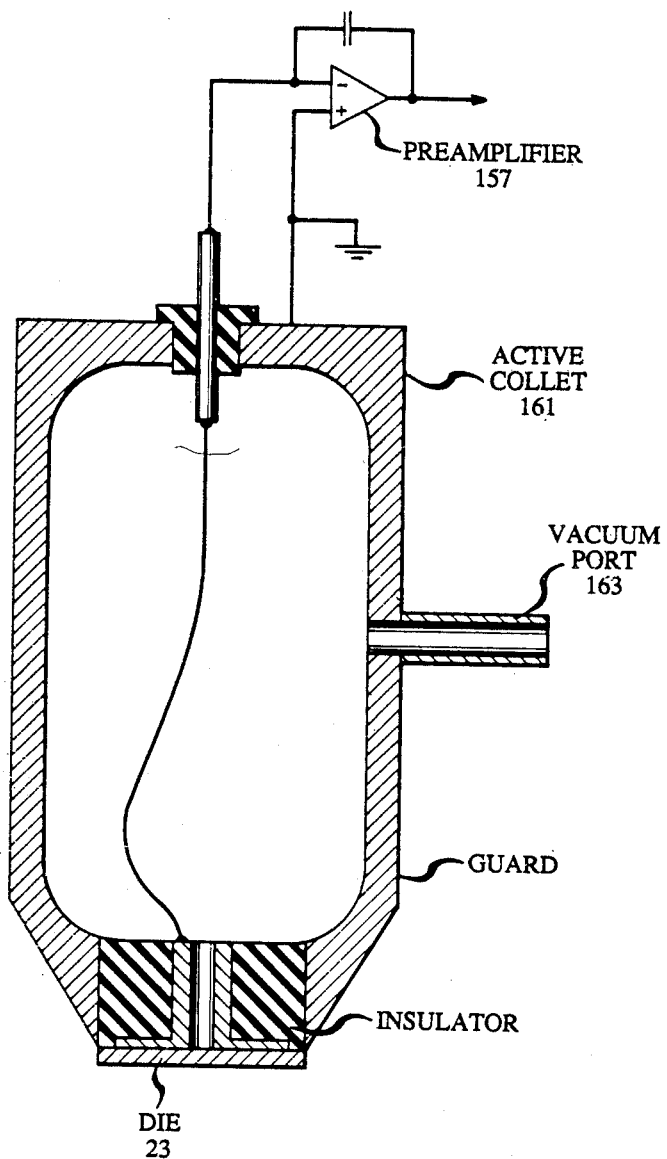
FIG. 16 illustrates an active die pick-up collet.

FIG. 1 illustrates our preferred arrangement for measuring topography. A small coaxially guarded movable probe 13 is placed a distance above a large metal plate 20. The conducting tip of probe 13 is insulated (by means not shown) from its grounded body. The insulation can be arranged as shown in FIG. 16, but without the central vacuum chamber. A radio frequency oscillator 10 and an operational integrating preamplifier 11 provide the means to measure the capacitance between the tip of probe 13 and the plate. The displacement current flowing from plate 20 to the tip of probe 13 tip produces a preamplifier output voltage 3 whose in-phase magnitude is proportional (in phase or 180° out-of-phase with radio frequency source 10 because of the feedback capacitance around preamplifier 11) to the mutual capacitance and is therefore the signal of interest. The capacitance is increased by placing the detector package 16 in the region between probe 13 and plate 20 and in close proximity to the probe 13. The package, illustrated in cross sectional view, is shown floating in the gap. It may as well rest directly on the bottom plate or be separated from it by either a conductive or insulating layer.

Motions of the probe parallel to plate and package produce measured capacitance changes that correspond to the surface topography of package 16 directly under the probe 13. This works well for insulating and conductive materials. Conductive materials, however, because of their stronger effect, appear as if they are closer to the probe than insulators of the same height.

Figure 2:
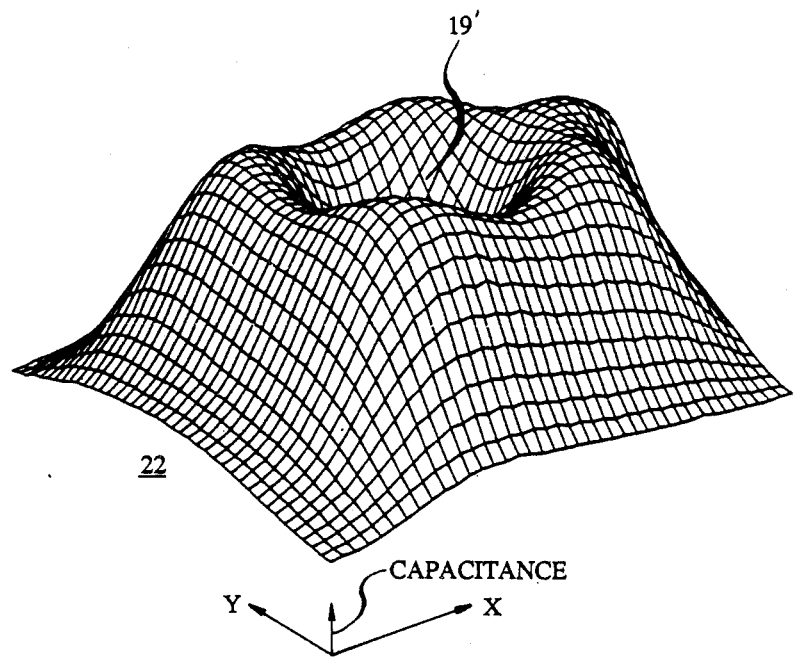
FIG. 2 illustrates the measured bonding pad capacitance topography obtained by sampling in a regular array over the pad site. These data are displayed in perspective form.

FIG. 2 show, in perspective form, the measured capacitance topography data of the pad region 17 sampled on a 30 micron pitch planar grid. The 50 micron diameter probe is approximately 100 microns above the pad for this measurement and the measurement grid corresponds to the grid lines on the figure. The response may be described as the convolution of the probe tip shape with the pad shape together with a blurring and weakening term due to the object-to probe gap. As the capacitance data 22 of FIG. 2 show, at this resolution the hole 19 for the optical fiber that brings the light to the die is essentially resolved, as shown by the image 19' of the hole in the capacitance topography 22.

Geometrically Aligned Die Placement

Referring again to FIG. 3, consider the pad topography as measured when a photodector die 23 is used as a probe tip. In addition to die 23, a die holding collet 14 also functions as a part of probe 13 as shown in FIG. 3. The collet 14 picks up, holds and releases the die by means of a small central hole connected to a variable vacuum supply, as shown in more detail in FIG. 16. Again, insulation of the probe tip from the body of collet 14 is arranged as shown in FIG. 16. The probe end dimensions here are advantageously matched to the dimensions of die 23. The probe tip area is now substantially increased as compared to that in FIG. 1 and the photodetector junction capacitance appears in series with the measured capacitance. The additional series capacitance is clearly not a function of position in this instance and hence has no detrimental effect on the measurement. The capacitance signal is fed back from preamplifier 11, through a filter 9 to motion control 21. The task of filter 9 is to process the capacitance and any other sensory data in order to provide an estimate of the configuration. Note that the method is entirely contactless; no connections need be made to package 16 or die 23.

Figure 4:
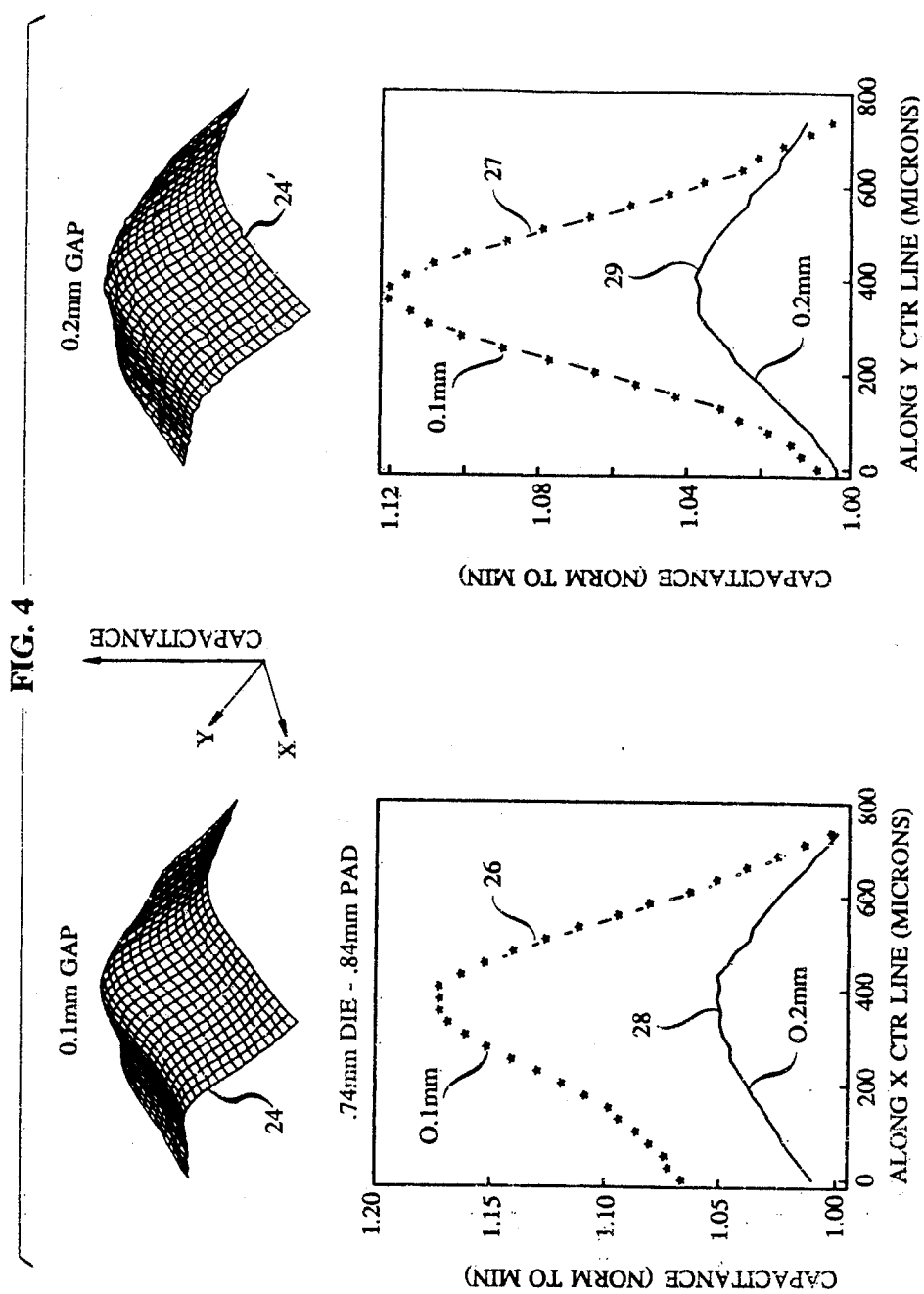
FIG. 4 shows capacitance data obtained as a function of planar position for two separation or gaps between die and pad. The data in the upper views are in perspective form while the lower views show data along lines through the center.

FIG. 4 shows the results for sampling capacitance on a 30 micron pitch planar grid using gaps between die 23 and pad 17 of 0.2 mm and 0.1 mm. These data 24 and 24' confirm the expected response described by a convolution of two similar squares with blurring. The lower views show data along the central row and column of the sampled date. The improved response for the 0.1 mm separation curves 26, 27 when compared to the 0.2 mm separation data curves 28, 29 is clearly evident.

Figure 5:
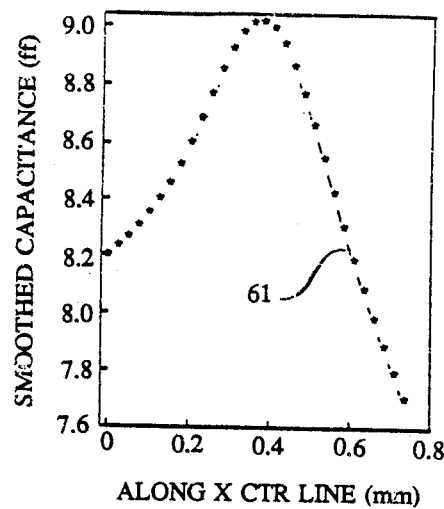
FIG. 5 shows detailed data for the case of 0.1 mm separation.
Figure 5:
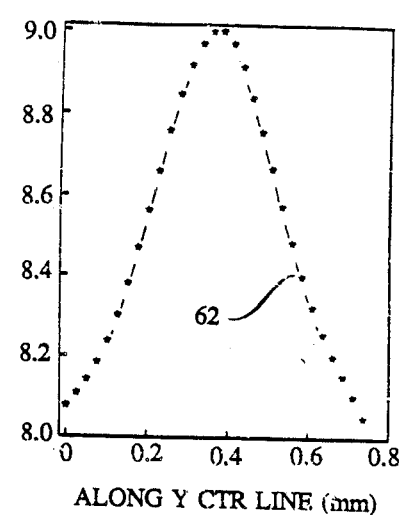
Figure 5:
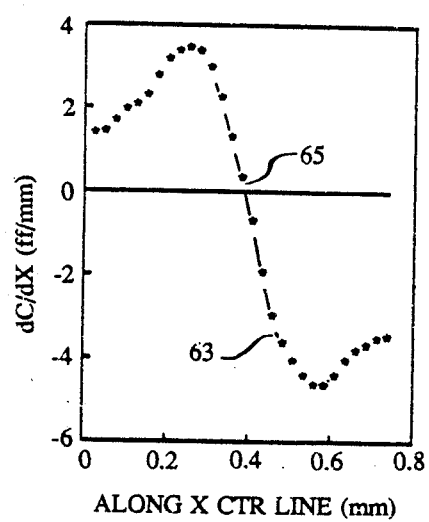
Figure 5:
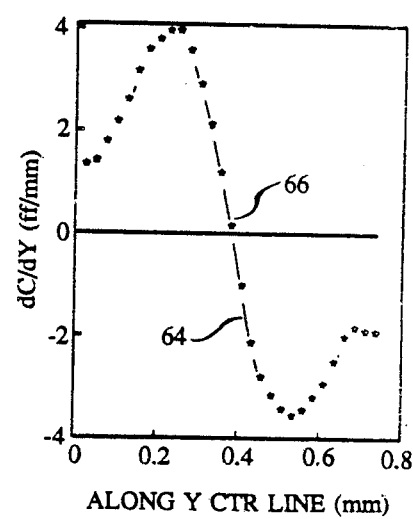

FIG. 5 shows the row and column data for 0.1 mm gap smoothed (in curves 61, 62) and differentiated (in curves 63, 64) to show how well simple peak detection of row and column data establishes the overlap of die and pad. The nominally aligned position occurs at 0.4 mm in both dimensions. The position resolution may be estimated from the ratio of the signal slope at zero crossings 65 and 66 to the amplitude noise. The slope to noise argument leads us to believe that final alignment accuracy is a small fraction of the objects dimensions, dependent on the gap, achieved by using a simple peak or gradient search procedure. Results from guiding laser dies onto their respective packages indicate that placement accuracies of less than 2% of linear die dimensions should be routine for three degrees of freedom alignment.

Die-to-Grooved Structure Alignment

As shown in FIGS. 6-9, the pick, place and bond assembly of photodetector die onto a micro-machined silicon package provides a somewhat more complicated example of capacitance guided homing.

Figure 6:
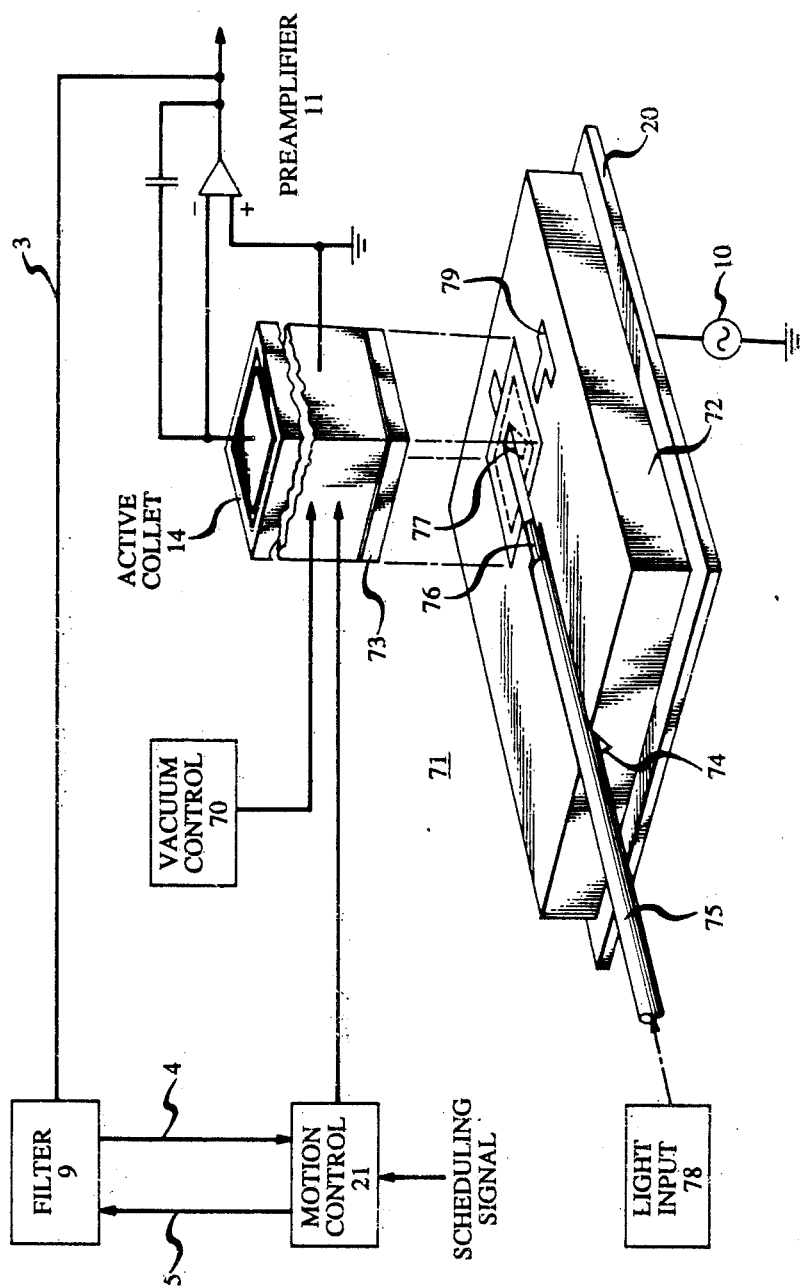
FIG. 6 illustrates an embodiment of the invention including an exploded view of a micro-machined silicon package, optical fiber and semiconductor diode die.

FIG. 6 illustrates an exploded view of assembly. The package 72 with its grooved structure 74, 76 captures and aligns the optical fiber 75 to the reflecting groove end facet 77. The closure task considered here is to geometrically align the detector die 73 with the groove end facet 77 at a small distance above the package 72 top surface.

Figure 7:
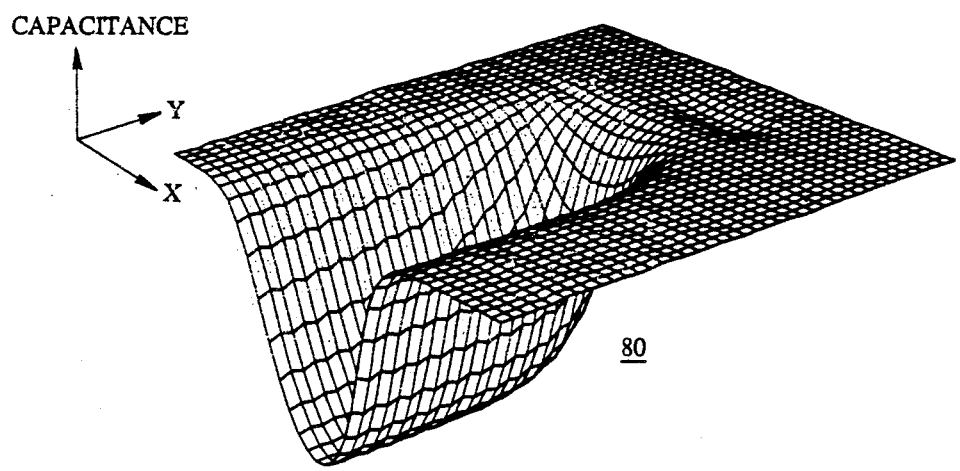
FIG. 7 illustrates the small probe capacitance topography of the die bonding region of a grooved substrate photodector package, as shown in FIG. 6. The measurement arrangement shown in FIG. 1 was utilized.

FIG. 7 shows the small probe capacitance topography 80 of the die mounting region of a detector package that has a special groove structure used to guide the light to the photodetector. The topography, which is spatial variation of capacitance in perspective form 65, was measured using the apparatus described in FIG. 1 with a 30 micron sampling grid projected onto the capacitance data.

In FIG. 6, the detector die 73 is to be placed with fixed relationship to the groove end area 77 shown.

The groove end area 77 has a sloping, reflecting surface that is intended to reflect light from the optical fiber 75 to the detector active region in die 73. Die 73 is picked up by the vacuum action of collet 14, which is the principal portion of probe 13. The vacuum chamber of collet 14, which is like that shown in FIG. 16 is shown coupled to vacuum control 70.

In addition to the sensed capacitance signal, which is fed back from amplifier 11, motion control 21 receives a scheduling signal, which is intended to move die 73 and assembly 71 relatively toward closure, especially when the capacitive signal is weak. This type of combining of control signals is best accomplished by a Kalman filter, as discussed elsewhere herein.

Figure 8:
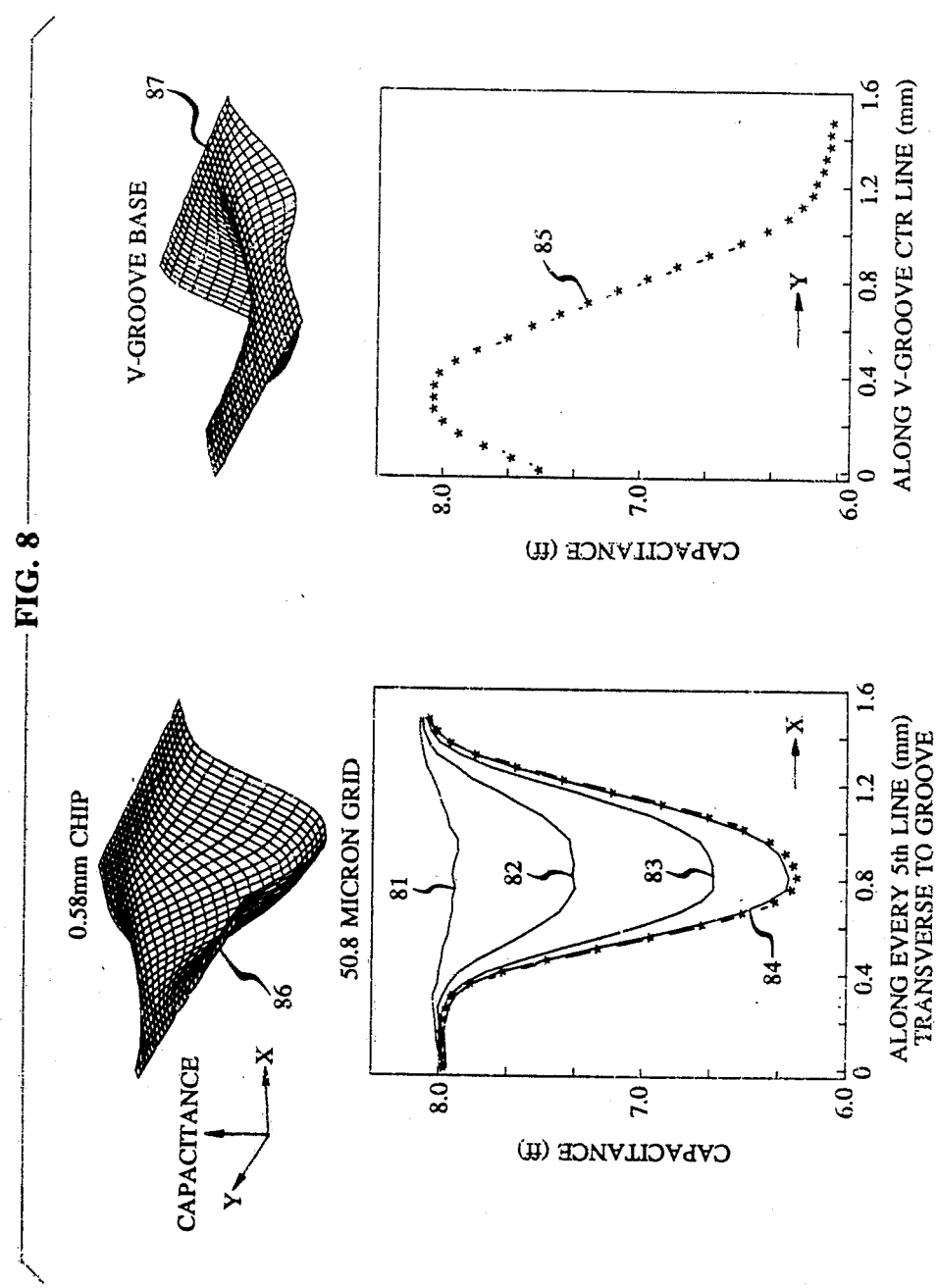
FIG. 8 illustrates perspective views and cross-sections of the capacitance topography of the configuration of a photodector die 73 of FIG. 6 with respect to the grooved structure.

FIG. 8 shows, in the upper portion, two perspective views of sampled capacitance data obtained with the active collet 14 and photodetector die 73. The lower portion of the figure shows data slices (curves 81–84) across and along (curve 85) the centerline of the groove. Here is an example where the aligned position does not correspond to a simple maximum or minimum in capacitance. The placement location may be associated with the centerline of the groove and at the ½ height along the upward slope at the groove end.

Placing the Die and Photo-Capacitance Guided Assembly

The capacitance-guidance method allows the die to be put into a geometrically aligned condition a prescribed small distance above its final position by a close-loop control homing procedure.

The aligned condition for a photodetector or a solid state laser is often more demanding than geometric alignment. There, the alignment of interest is that of the incoming or outgoing light with the active region of the device. We can extend capacitance guidance to include the final optical alignment by making use of the fact that the junction capacitance of the active region is in series with the measurement and that the junction capacitance is a function the light entering. Light entering the active region of an open circuit junction causes the junction capacitance and dissipation to be modified. These effects are well known and are described by G. L. Miller, D. V. Lang and L. C. Kimerling, "Capacitance Transient Spectroscopy", Ann. Rev. Material Sci., 7:377–448 (1977). FIG. 9 shows the effect on junction capacitance and dissipation as a narrow light beam is scanned across the surface of a laser diode. The capacitance and dissipation peak positions correspond to the optically aligned position of light beam to the laser diode.

A photodetector may be optically aligned with the optical system of the package 16 of FIG. 3 or package 72 of FIG. 6 by first reaching the geometric placement position to achieve a coarse alignment, then energizing the light from light source 78 into fiber 75, while repositioning to maximize the capacitance or dissipation effect due to the light. Note that the alignment is established before the die is bonded and before contact is made.

As mentioned above, the final position of a semiconductor laser diode may be an even better example of slight offset from the maximum passive capacitance position, which can be achieved by using the accentuated effects achieved when the junction is illuminated and which may be even more advantageous because of the more complicated structure of a laser diode and its more demanding positioning requirements.

If the die 73 is a semiconductor laser diode die, when light source 78 is turned on and directs light through fiber 75, if the photons are readily absorbed in the laser junction or near-junction region, then the accentuated effects shown in FIG. 9 are achieved.

The junction capacitance of die 73 then increases the total measured capacitance as shown in curves 91 of FIG. 9A. Notice the significant capacitance increase as compared to a reasonable extrapolation of the nearby capacitance values 92 for the unilluminated areas.

The dissipation increase shown in curves 93 of FIG. 9B are even more dramatic as compared to the small background values 94 in the absence of illumination. The dissipation is detected as the portion of the measured current which is 90° out-of-phase with the voltage from radio frequency source 10 (again, because of the feedback capacitance around preamplifier 11). The peak of curves 91 or 93 may be offset by a small but significant value from the maximum values in the absence of illumination and will nearly always yield a better positioning of die 73 for injecting light into fiber 75.

Note that this improved positioning of the die 73 is achieved without making any electrical contacts to die 73. Further, it is not required to emit light, but rather merely absorb it.

PICKING UP THE DIE

Capacitance-guidance may be advantageously used to pick up the die. Consider a die resting on or above some portion of plate 20. By the same methods used to place a die in a geometric placement position relative to a package we may place the probe end in a corresponding position above the die that is aligned and favorable for vacuum pick up.

MEASUREMENT SYSTEM CONSIDERATIONS FOR CAPACITANCE GUIDED HOMING

A feedback control system based on a Kalman filter (filter 9 in FIG. 3) should be optimal for this estimation and control problem where the configuration 4 must be estimated from multiple sensor data with variable sensor errors. Data 5 from the position sensors of the mechanism provides a crude but fixed error measure of the configuration. More specifically, the geometric capacitance measurement exhibits configuration estimate errors that improve as the aligned condition is approached to some small fixed value. Photo-capacitance measurements, when used, exhibit configuration estimate errors that improve as the aligned condition is approached to some yet smaller fixed value. A properly designed Kalman filter combines sensory and sensory error data to provide an optimal estimate of the configuration. A description of Kalman filters and their application to stochastic models, estimation and control is found in a book by Peter S. Maybeck, "Stochastic Models, Estimation and Control, Volume 1," Academic Press, 1979.

THE PEG IN HOLE PROBLEM

Figure 10:
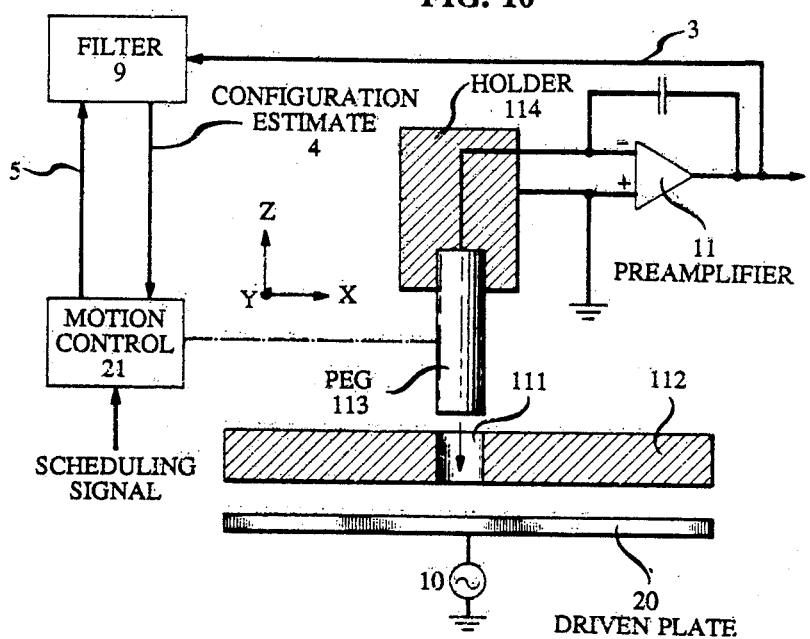
FIG. 10 shows another embodiment of the invention for inserting a peg in a hole.

FIG. 10 illustrates a favorable arrangement for monitoring the configuration of a hole 111 in a metal plate 112 with respect to a peg 113 so that peg-into-hole homing is facilitated.

Figure 11:
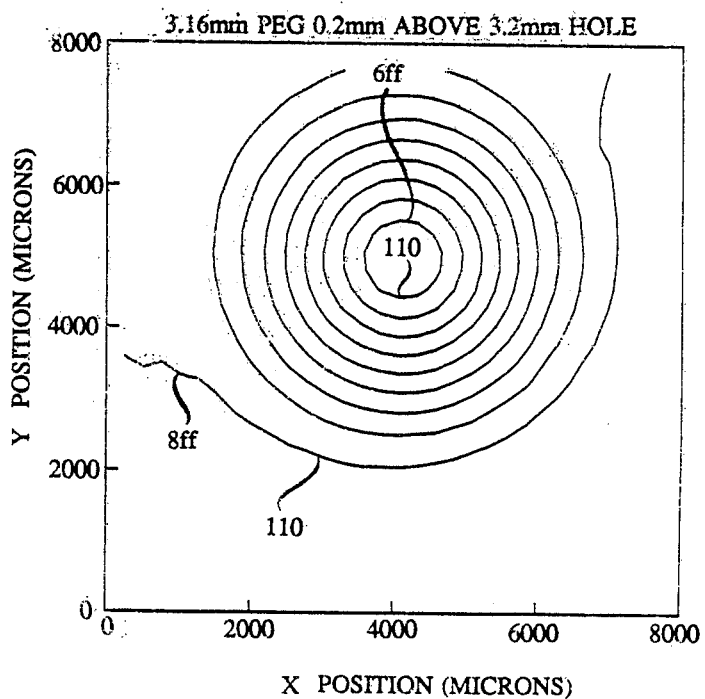
FIGS. 11-14 show capacitance measurement data useful in explaining the operation of that embodiment.

FIG. 11 shows the equally spaced capacitance contour data obtained by planar motion a fixed distance above the plate of the peg 113 relative to the hole 111 while sampling capacitance. The response, shown by equally spaced capacitance contours 110, has a significant data radius of one peg diameter. Beyond this range the configuration estimate from the mechanism sensors will be dominant in a Kalman filter since there is no usable change in capacitance and hence a very large error. Within this capture radius the capacitive estimates improve and finally become dominant in the configuration estimate. A closed-loop controller, using, for example, configuration estimates and their spatial derivaties (see FIG. 14) combined with a steepest decent algorithm, can provide control signals to servo control 21 such that the peg will be inserted into the hole. We will use a much simpler and much less efficient filter and control algorithm to illustrate this assembly task.

Figure 12:
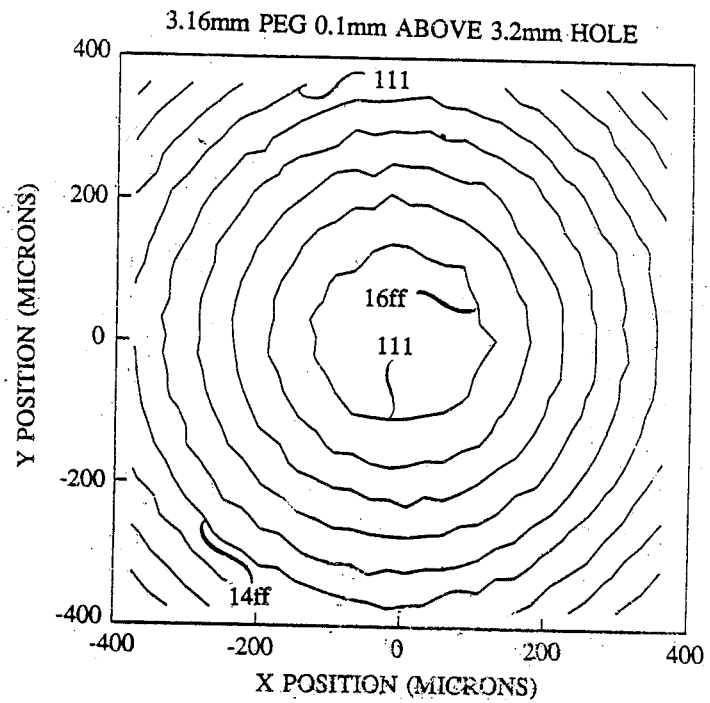

Sampled data 110 is used to estimate the minimum capacitance position. This estimate is used as the center of a reduced range and new capacitance data sampling producing equal spaced capacitance contours 111 shown in FIG. 12. The minimum estimate is used to predict the center of the hole and the peg is positioned at the new estimated x-y aligned location and advanced into the hole.

Figure 13:
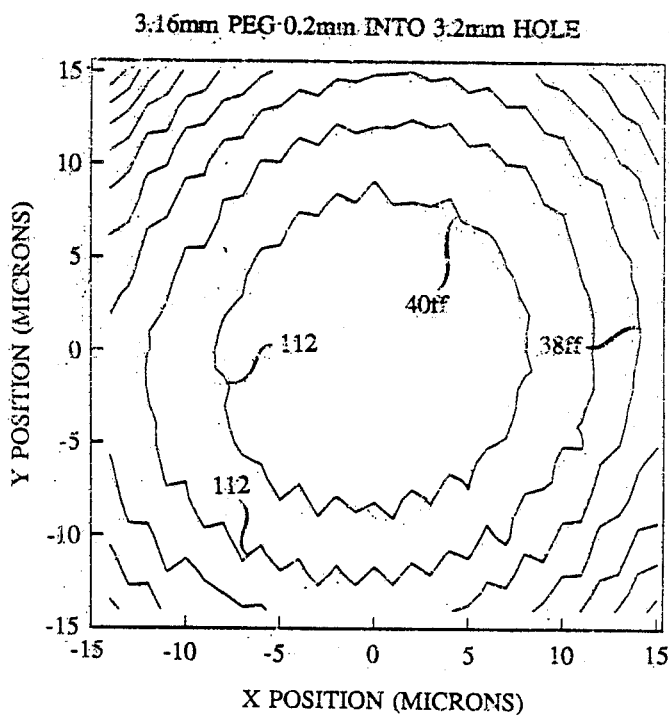

FIG. 13 shows the equally spaced capacitance contours 112 obtained when the inserted peg 113 is scanned inside the hole 111. The figure center corresponds to the location of the estimate used in entering the hole. Here we begin to see the effects of a serpentine scan and the backlash of the position control. The degree of accuracy achieved is illustrated in the capacitance control data 112 sampled about the predicted center as shown in FIG. 13. Since the response is symmetrical we need not actually visit the center to determine its position.

Figure 14:
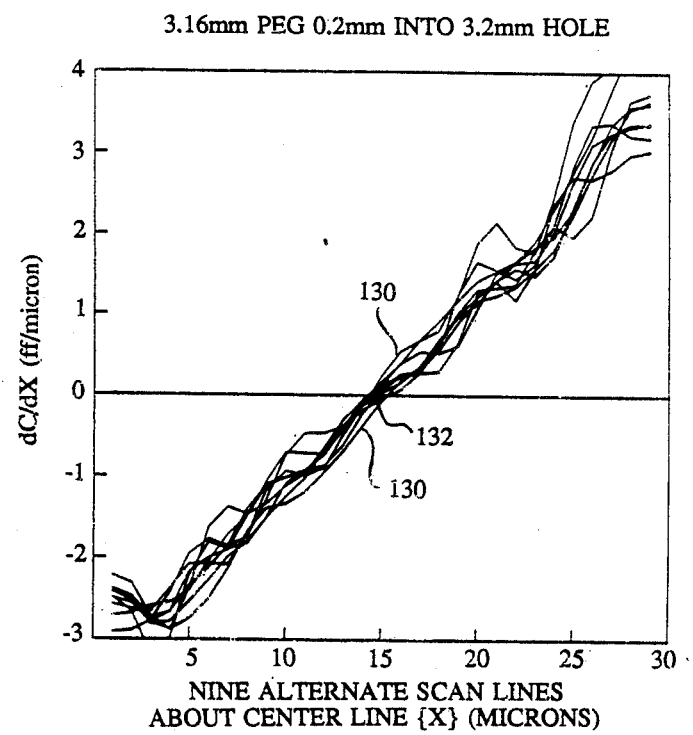

FIG. 14 illustrates this by showing the derivative of smoothed data curves 130 along a scanned line through the center and along lines separated in 2 micron increments. The waist of the zero crossing 132 indicates the differences in center estimates.

A useful figure of merit for such servo systems is the ratio of the capture range to the final positioning accuracy. The peg in hole example shows a figure of merit of several thousand to one. The figure of merit increases with closeness of fit. As the clearance decreases the accuracy automatically improves.

The peg 113 may be advantageously acquired by the holder 114 by the method described for die pickup.

TAB TECHNOLOGY EXAMPLE

Electrical connections between an integrated circuit die and the package lead frame can be made with a process called tape automated bonding (TAB). In this process the electrical connecting element between the die 173 and the lead frame 143 is a set of metal conductors 145 supported by an organic polymer tape 141. The tape 141 is supplied on reels in industry standard formats and contains many repetitions of the conductor pattern. The die 173 is prepared with metal bumps 147, typically gold on the bond pads. In the first part of the TAB process the mechanical bonding of the inside portion of the conductor pattern 145 to the die 173 is completed. This is called inner lead bonding (ILB). In ILB the conductor pattern 145 on tape 141 is positioned over (or under) the die and aligned with the bond pad bumps 147, in this case by using our capacitive sensing and control technique, as explained above.

Figure 15:
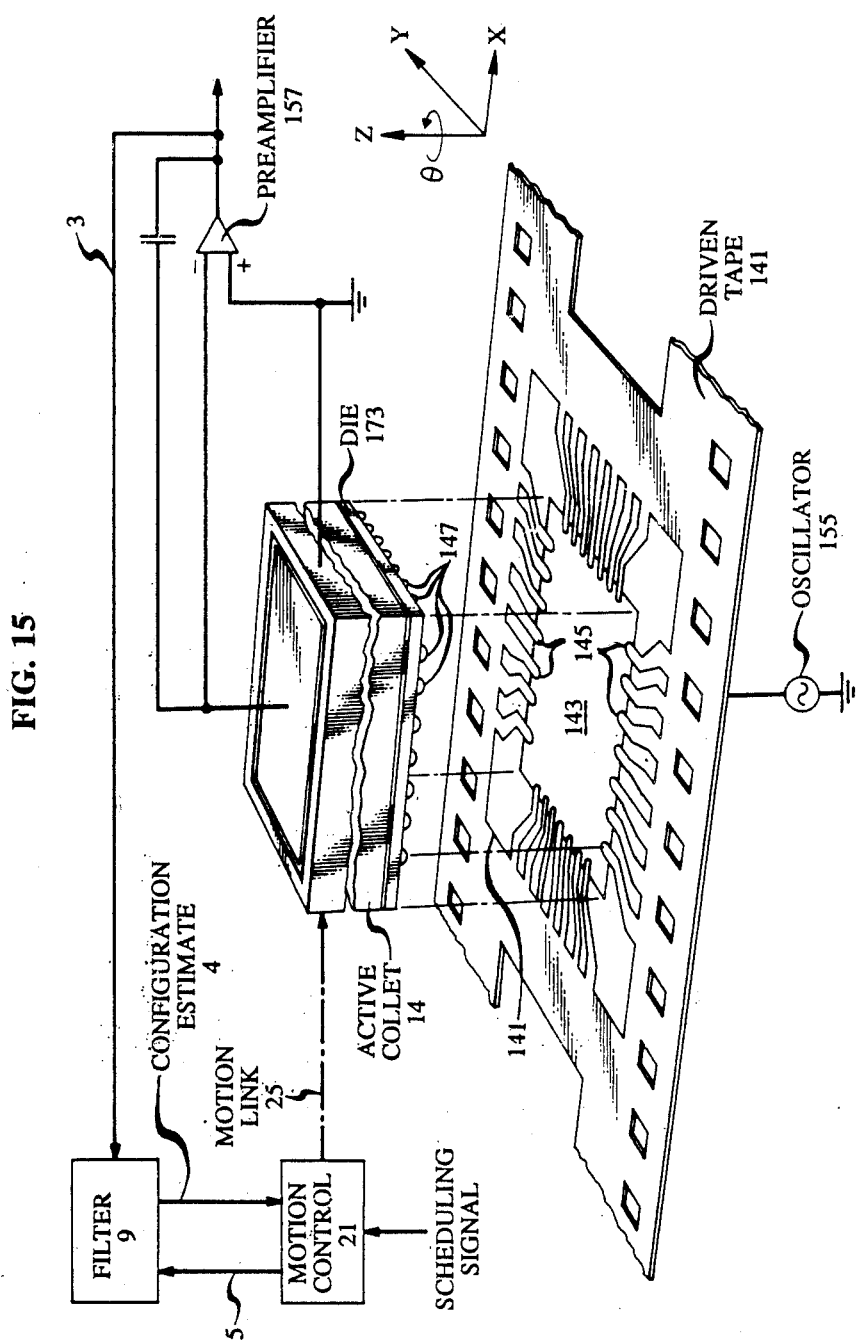
FIG. 15 is a pictorial showing of a TAB technology tape underlying a die with an arrangement for controlling the relative motion of a die and tape using capacitance guidance.

In the pictorial representation of FIG. 15, the tape fingers 145 and the corresponding metal connection bumps 147 of die 173 are clearly evident.

A heated tool (not shown) presses the tape 141 against the aligned die 173 supplying heat and pressure from below to the contact points to make a thermocompression bond. When the tool is withdrawn, the die is permanently fastened to the tape and can be reeled up with other die at other sites on the tape. Subsequent package assembly processes can include testing on tape and outer lead bonding (OLB) to the package lead frame. Again, OLB can use our sensing and control technique. A more detailed description of TAB can be found in a recent review paper by Paul Hoffman, "TAB Implementation and Trends," Solid State Technology, Jun. 1988.

The tape 141 in FIG. 15 consisted of copper conductors on a 0.0005 inch polymeide film substrate. The copper conductors were 0.0014 inches thick by approximately 0.004 inches wide at the bonding point and coated with 30 microinches of gold. The die bond-pad bumps are gold, about 100 $\mu$m and 10 $\mu$m high. The bond pad pitch is 200 $\mu$m (0.008 inches). Capacitive TAB Alignment FIG. 15 illustrates a favorable arrangement for monitoring the alignment of die 173 to the TAB tape 141 during ILB using capacitance guidance. The tape is driven electrically by an RF oscillator 155. The displacement current flowing to the die 173 produces an output voltage in a preamplifier 157 which is proportional to the mutual capacitance and is therefore the signal of interest. The short length of thin metal tape shown has sprocket holes along each edge and, when viewed at low resolution, a rectangular cutout at each die site. The preamplifier is connected to the die advantageously via an active pickup collet 161 as illustrated in FIG. 16.

Figure 17:
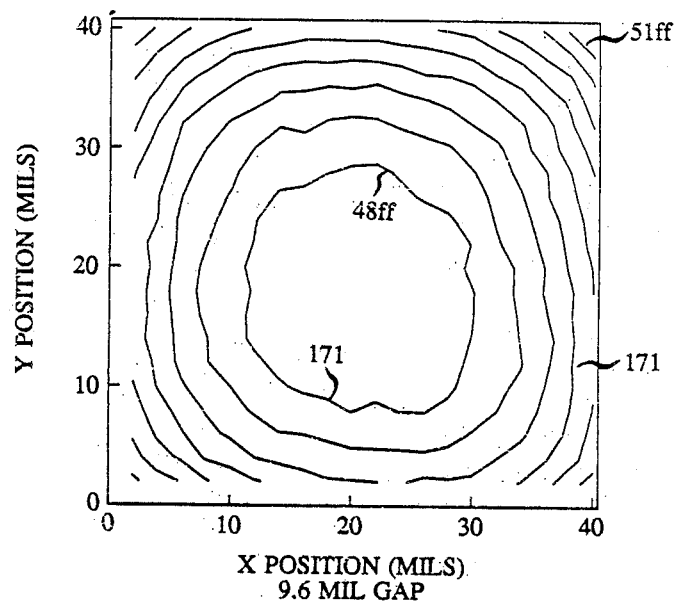
FIG. 17 shows curves that are equally spaced contours of capacitance obtained by moving the die in a plane above the tape and in the neighborhood of the site.
Figure 18:
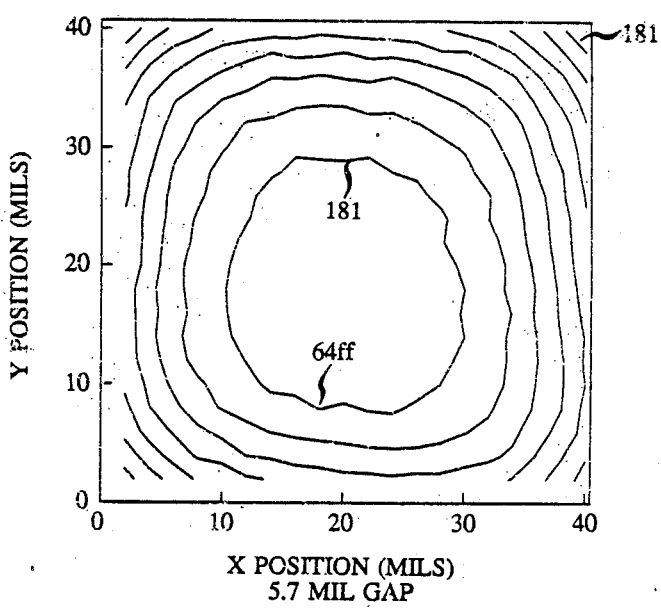
FIGS. 18-20 show curves that are equally spaced contours of capacitance obtained by moving the die in a plane at progressively lesser distances above the tape and in the neighborhood of the site.
Figure 19:
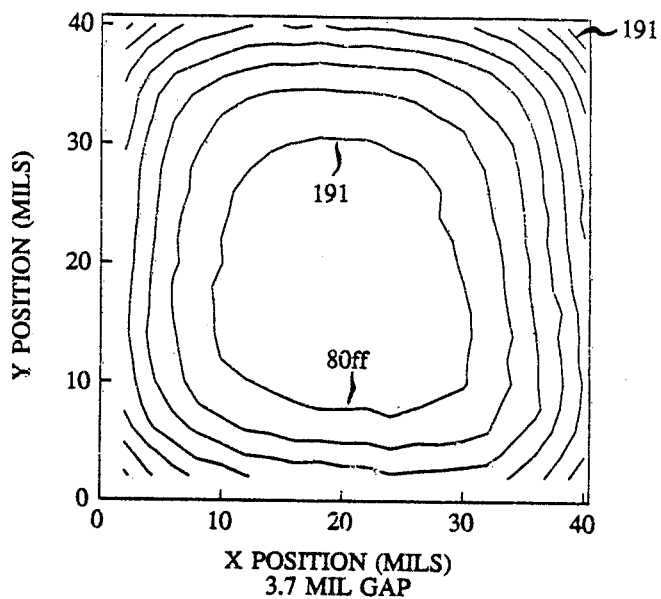

FIG. 17 shows contours of capacitance 171 obtained by moving the die 173 in a regular x-y array in a plane 9.6 mils above the supporting plastic tape 141 and in the neighborhood of the site while sampling capacitance. The minimum in capacitance lies in the approximate center of the figure and its location corresponds roughly to the aligned condition. The minimum in capacitance is near the center of the figure with magnitude 48ff and the maximum value in this scanning range is 51ff. Evidence of the rectangular structures and the fact that the die overlaps the hole become stronger as the gap is reduces further as shown in FIGS. 18 and 19. Equally spaced contours of capacitance 181 or 191 are obtained by moving the die in a regular x-y array in a plane 5.7 mils and 3.7 mils above the supporting plastic tape and in the neighborhood of the site. The capacitance minimum is 64ff or 80ff, respectively. The capacitive response to planar x-y motion may be described as the convolution of the die shape with that of the site together with a blurring and weakening term due to the gap. The capacitance image of a square peg over a smaller square hole has a shape similar to the surface of an inverted and truncated pyramid. The area of the flat bottom corresponds to the area of overlap between die and site when they are aligned.

Figure 20:
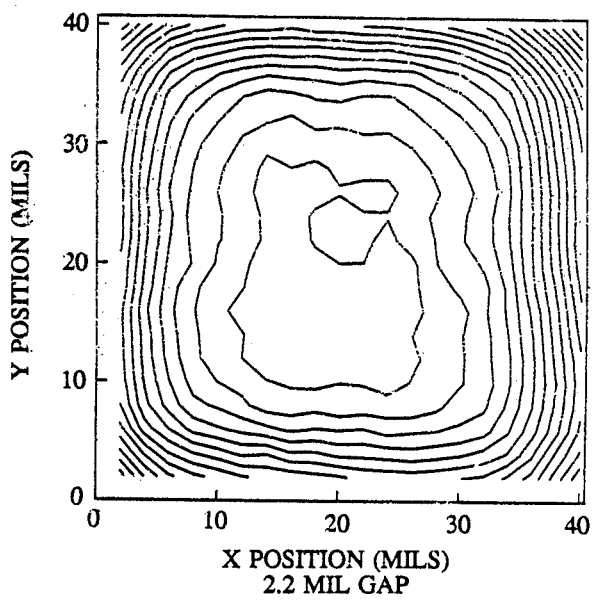

As the gap is reduced to 2.2 mils, blurring decreases and we begin to see some additional structure in the central region in FIG. 20. At sufficiently small gaps a local maximum should appear in the image when the fingers and bonding bumps align.

Figure 21:
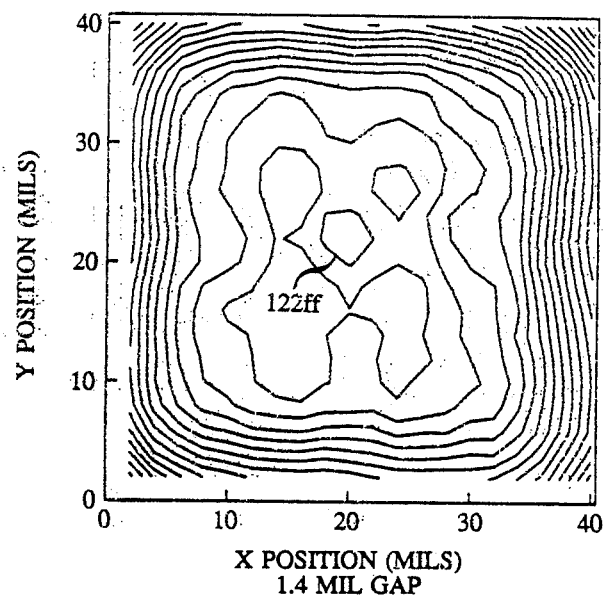
FIG. 21 shows the details of the overlap of TAB finger tips with the die pad in FIG. 15 becoming evident at a decreased separation.
Figure 22:
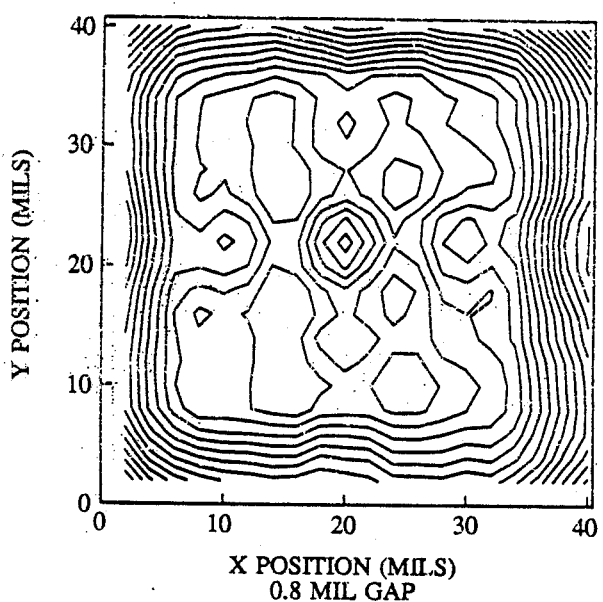
FIG. 22 shows the details of the overlap of TAB finger tips with the die pad becoming strong at a decreased separation between die and tape.

FIGS. 21 and 22 show more detail as the gap is reduced to 1.4 mils and then to 0.8 mils and consequently blurring is reduced. The central maximum for capacitance in FIG. 22 is 122ffs.

Figure 23:
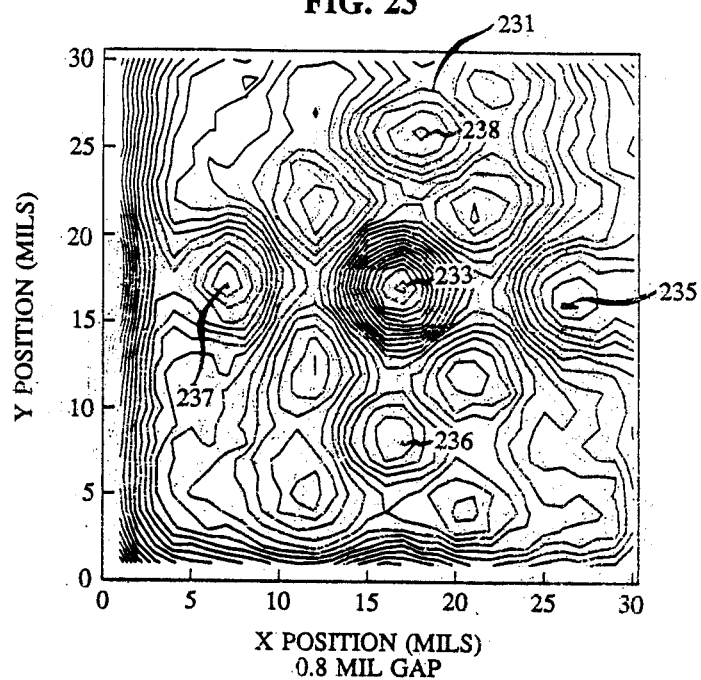
FIG. 23 shows a more detailed view of the capacitance contour for FIG. 15, but at the FIG. 22 separation.
Figure 24:
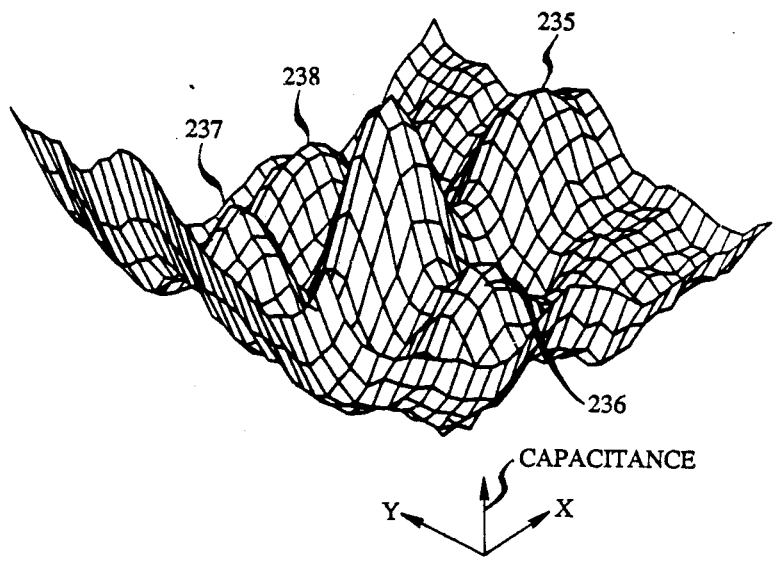
FIG. 24 shows data of FIG. 23 displayed in perspective view.

FIGS. 23 and 24 show detailed results in contour form and perspective form. The central strong peak 233 in FIGS. 23 and 24 is due to overlap of all fingers with pads. The satellite peaks 235, 236, 237 and 238 occur at locations displaced one finger spacing from the aligned configuration. In other words, the location of the central peak 233 in both figures corresponds to the aligned condition while the four resolved satellite peaks are each displaced one finger pitch from the aligned condition.

FIGS. 25a and 25b show the row and column data while FIGS. 25c and 25d show these data smoothed and differentiated (gradient data). These latter data illustrate how well a gradient search algorithm may establish alignment. The position resolution may be estimated from the relation of the signal slope at zero crossing 251, 253 to the amplitude noise. The slope to noise argument leads us to believe that measurement-limited alignment error is a small fraction of 1 mil for these data.

The inherent blurring with separation may facilitate an efficient closure algorithm. A closure algorithm that tracks the initially crude but, because of blurring, single x-y gradient minima while reducing the z separation appears to lead directly to the central minima of the aligned configuration in this example.

Figure 26:
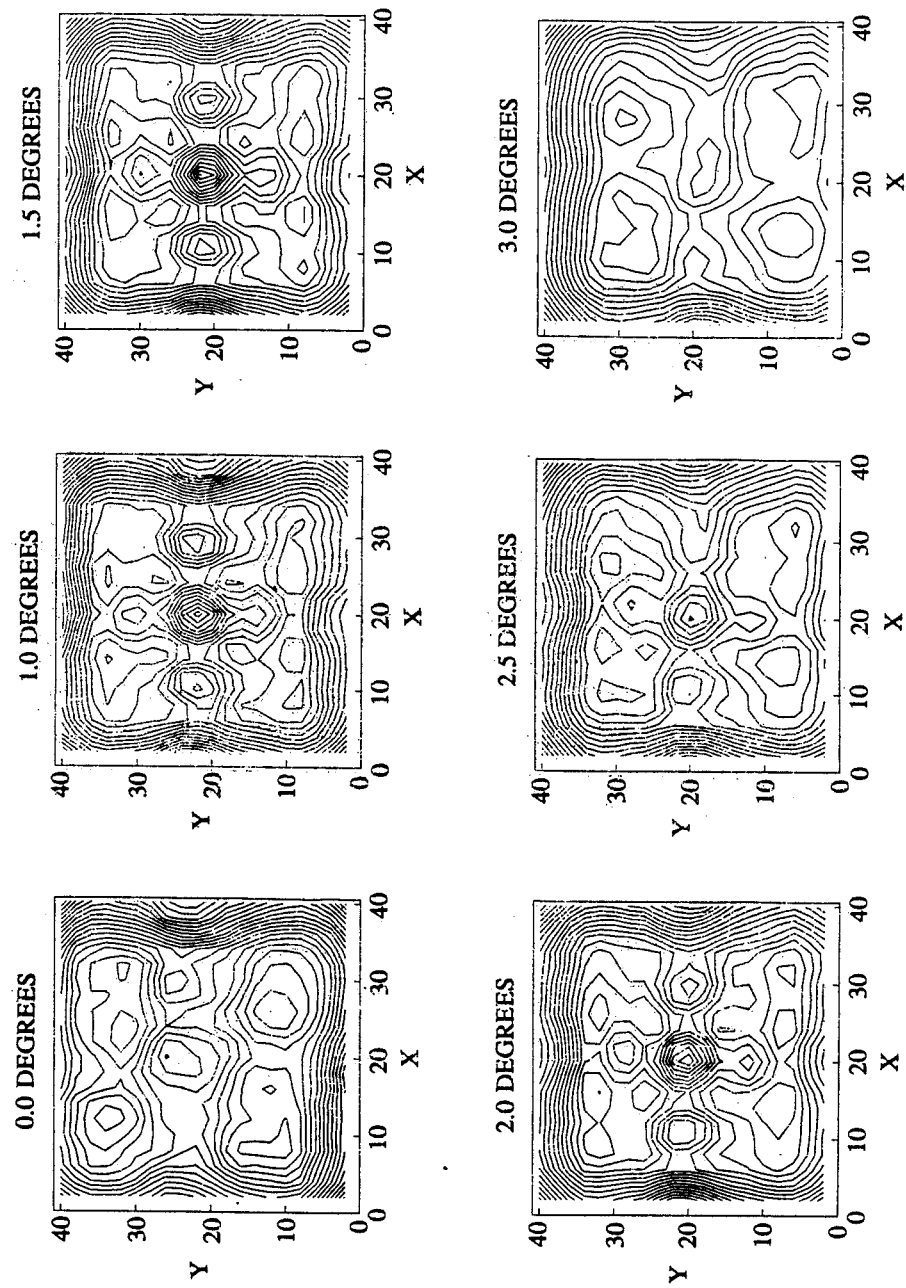
FIG. 26 shows curves which are capacitance contours taken with fixed separation with respect to rotation in the plane of the die 143 with respect to tape 141 of FIG. 15.

The effect of rotation in the plane between die and bonding site is shown in FIG. 26. The spatial derivatives of capacitance in the neighborhood of the central peak are the alignment measures here since z is held fixed at 0.8 mil gap. The central peak 271 is sharpest with respect to rotation at indicated angle of approximately 1.5°. This condition is actually the aligned condition, as the original 0° reference position was arbitrarily selected "by eye" originally.

Capacitance guidance is seen from the diverse examples above to have a potential to provide a simple, direct and well understood means for part-to-part homing. Assembly via homing has important economic side benefits. The complexity and precision requirements of the assembly machines and the assembled parts can often be reduced. Since homing is between mating surfaces, only they need be well defined. The large capture range of the method also reduces constraints on the initial configuration of parts.

We claim:

1. Apparatus for assembly, of the type comprising
   means for acquiring two objects for the purpose of relative motion therebetween,
   means for providing motions including said relative motion in response to control signals, and
   means for sensing deviations from a desired configuration to provide at least a part of the control signals,
   said apparatus being characterized in that
   the sensing means includes
     means for defining at least one capacitance affected by at least at least one of said deviations,
     means for sensing changes in said capacitance to provide at least a part of the control signals, and
     means for transmitting and means for receiving a beam of radiation to provide a radiation-responsive part of the control signals, and
   the motion-providing means includes means for combining the change in capacitance and the radiation-responsive part of the control signals.

2. Apparatus for assembly, of the type claimed in claim 1,
   said apparatus being further characterized in that
   the combining means includes weighting means for giving primary weight to a portion of the control signal while in a selected range.

3. Apparatus for assembly, of the type claimed in claim 1,
   said apparatus being further characterized in that
   the means for transmitting and the means for receiving a beam of radiation, either as distinct from or as combined with the first and second objects, are ultimately so disposed with respect to the first and second conductive elements that an incremental change in the capacitance occurs in dependence upon the intensity of the beam of radiation.

4. Apparatus for the assembly of the type claimed in claim 3,
   said apparatus being further characterized in that
   the weighting means is adapted to give predominant weight to changes in capacitance attributable to received intensity of the beam of radiation, whereby the final relative positioning of the two objects will be offset from the position indicated by changes in capacitance in the absence of the beam of radiation.

5. Apparatus for assembly of the type comprising
   means for acquiring two objects for the purpose of relative motion therebetween,
   means for providing motions including said relative motion in response to control signals, and
   means for sensing deviations from a desired configuration to provide at least a part of the control signals,
   said apparatus being characterized in that
   the sensing means includes
     means for defining at least one capacitance affected by at least one of said deviations, and
     means for sensing changes in said capacitance to provide at least a part of the control signals, and
   the motion-providing means includes means for generating a second part of the control signals to schedule motion of at least one of the objects and means for combining said second part of the control signals with the part provided by the aforesaid sensed changes in capacitance, with a deviation-dependent change in weighting away from said second part.

6. Apparatus for assembly of the type claimed in claim 5,
   said apparatus being further characterized in that
   the combining means includes a weighting means adapted to give increasing weight to a capacitance-dependent portion of the control signal with reduction of deviation, whereby scheduled motion is ultimately unimportant in determining the final relative position of the two objects.

7. A method for the assembly of apparatus, of the type comprising
   acquiring two objects for the purpose of relative motion therebetween,
   providing motions including said relative motion in response to control signals, and
   sensing deviations from a desired configuration to provide at least a part of the control signals, said method being characterized in that
sensing deviations includes
defining at least one capacitance affected by at least one of said deviations,
sensing changes in said capacitance to provide at least a part of the control signals, and
transmitting and receiving a beam of radiation to provide a radiation-responsive part of the control signals, and
providing motion includes combining the change in capacitance and the radiation-responsive part of the control signals.

8. A method for assembly, of the type claimed in claim 7,
said method being further characterized in that
combining the change in capacitance and the radiation-responsive part of the control signals includes giving primary weight to a particular portion of the control signal while in a selected range.

9. A method for assembly, of the type claimed in claim 7,
said method being further characterized in that
transmitting and receiving a beam of radiation, includes intermittently transmitting the beam so that an incremental change in the capacitance occurs in dependence upon the intensity of the beam of radiation.

10. A method for the assembly of the type claimed in claim 9,
said method being further characterized in that
combining the change in capacitance and the radiation-responsive part of the control signals includes giving predominant weight to changes in capacitance attributable to received intensity of the beam of radiation, whereby the final relative positioning of the two objects will be offset from the position indicated by changes in capacitance in the absence of the beam of radiation.

11. A method for assembly of the type claimed in claim 7,
said method being further characterized in that
providing motions includes generating a second part of the control signals to schedule motion of at least one of the objects and means for combining said second part of the control signals with the part provided by the aforesaid sensed changes in capacitance, with a deviation-dependent change in weighting away from said scheduling part of the control signals.

12. A method for assembly of the type claimed in claim 7,
said method being further characterized in that
combining the change in capacitance and the radiation-responsive part of the control signals includes giving increasing weight to a capacitance-dependent portion of the control signal with reduction of deviation, whereby scheduled motion is ultimately unimportant in determining the final relative position of the two objects.

13. Apparatus for bringing two objects into a desired assembly, of the type comprising
means for providing motions including relative motions of said two objects in response to control signals, and
means for sensing deviations from a desired configuration to provide at least a part of the control signals,
said apparatus being characterized in that
the sensing means includes
means for defining a capacitance affected by at least one of said deviations,
means for sensing changes in said capacitance to provide at least a part of the control signals, and
means for transmitting and means for receiving a beam of radiation to provide a radiation-responsive part of the control signals, and
the motion-providing means includes means for combining the change in capacitance and the radiation-responsive part of the control signals.

14. Apparatus for acquiring an object to be brought into a desired assembly, of the type comprising
means for providing motions in response to control signals, and
means for sensing deviations from a desired configuration of the object and the motion providing means to provide at least a part of the control signals,
said apparatus being characterized in that
the sensing means includes
means for defining a capacitance affected by at least one of said deviations,
means for sensing changes in said capacitance to provide at least a part of the control signals, and
means for transmitting and means for receiving a beam of radiation to provide a radiation-responsive part of the control signals, and
the motion-providing means includes means for combining the change in capacitance and the radiation-responsive part of the control signals.

15. A method for bringing two objects into a desired assembly, of the type comprising the steps of
providing motions including relative motions of said two objects in response to control signals, and
sensing deviations from a desired configuration to provide at least a part of the control signals,
said method being characterized in that
sensing includes
defining a capacitance affected by at least one of said deviations,
sensing changes in said capacitance to provide at least a part of the control signals, and
transmitting and receiving a beam of radiation to provide a radiation-responsive part of the control signals, and
providing motion includes combining the change in capacitance and the radiation-responsive part of the control signals.

16. A method for acquiring an object to be brought into a desired assembly, of the type comprising the steps of
providing motions in response to control signals, and
sensing deviations from a desired configuration of the object and the provided motion to provide at least a part of the control signals,
said method being characterized in that
sensing includes
defining a capacitance affected by at least one of said deviations,
sensing changes in said capacitance to provide at least a part of the control signals, and
transmitting and receiving a beam of radiation to provide a radiation-responsive part of the control signals, and
providing motion includes combining the change in capacitance and the radiation-responsive part of the control signals.

* * * * *